United States Patent [19]
Oguchi et al.

[11] Patent Number: 5,371,712
[45] Date of Patent: Dec. 6, 1994

[54] SEMICONDUCTOR MEMORY DEVICE HAVING DETECTION CIRCUITRY FOR SENSING FAULTS IN WORD LINES

[75] Inventors: Satoshi Oguchi, Ohme; Kazumasa Yanagisawa, Kokubunji, both of Japan

[73] Assignee: Hitachi, Ltd., Tokyo, Japan

[21] Appl. No.: 40,344

[22] Filed: Mar. 30, 1993

[30] Foreign Application Priority Data

Mar. 30, 1992 [JP] Japan .................. 4-106117

[51] Int. Cl.[5] .............................................. G11C 8/00
[52] U.S. Cl. ............................ 365/230.06; 365/201
[58] Field of Search ................. 365/230.06–230.08, 365/201–233, 225.7, 200, 210

[56] References Cited

U.S. PATENT DOCUMENTS 4,905,194  2/1990  Ohtsuka .................... 365/200
5,142,496  8/1992  Van Buskirk ............... 365/201

Primary Examiner—Eugene R. LaRoche
Assistant Examiner—A. Zarabian
Attorney, Agent, or Firm—Antonelli, Terry, Stout & Kraus

[57] ABSTRACT

A semiconductor memory device facilitated with a test circuit having a simple construction of a plurality of MOSFETs having their individual gates connected with a plurality of word lines in a memory array; and a testing pad for detecting the presence of an electric current flowing between the sources and drains of the plurality of MOSFETs. If the word line is short-circuited to the power supply to achieve an intermediate potential equal to or higher than the threshold voltage of the MOSFETs, an electric current will flow through the MOSFETs so that the presence of the short-circuit between the word lines and the power supply can be accurately detected.

52 Claims, 12 Drawing Sheets

MEMORY MAT DIAGRAM

MEMORY MAT   MAIN WORD DRIVER

MAIN WORD LINE SELECTOR

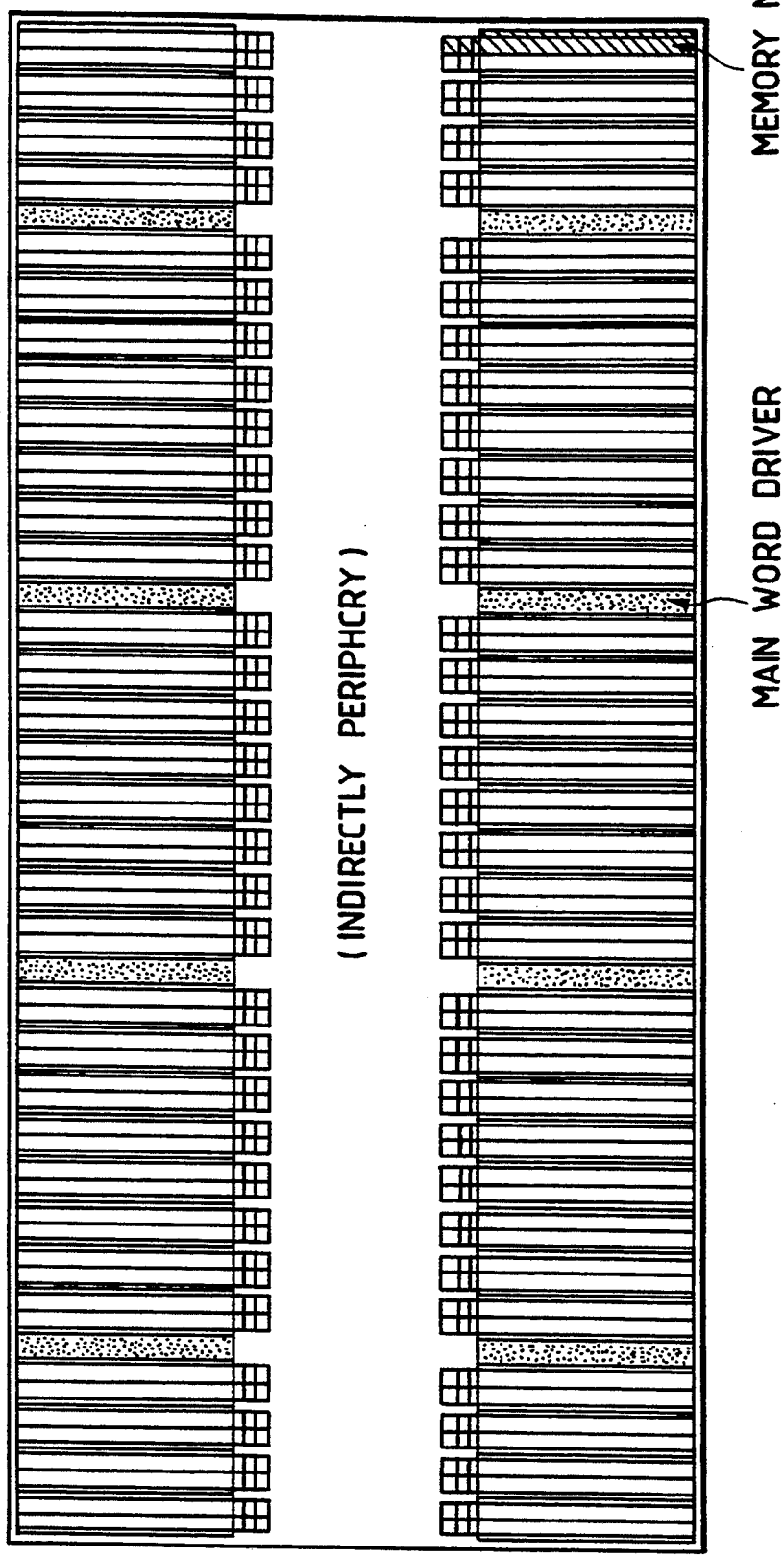
FIG. 9 GENERAL DIAGRAM OF 4M SRAM CHIP
(INDIRECTLY PERIPHERY)
MEMORY MAT
MAIN WORD DRIVER

LOCAL WORD LINE SELECTOR

SEMICONDUCTOR MEMORY DEVICE HAVING DETECTION CIRCUITRY FOR SENSING FAULTS IN WORD LINES

BACKGROUND OF THE INVENTION

The present invention relates to a semiconductor memory device and, more particularly, to a technology which is effective if applied to a testing technology for a static RAM (i.e., Random Access Memory) having a high storage capacity.

The tests in the static RAM are carried out by write-/read operations using a memory tester. This testing method of a memory is disclosed, for example, on pp. 97 of "Data Book Hitachi IC Memory No. 1" issued by Hitachi, Ltd., in March, 1991.

SUMMARY OF THE INVENTION

As new developments in semiconductor technology are being made, advances are also being made in the multi-layering of wiring lines. Along with such developments, it would be fair to assume that a word line and a power line may be short-circuited with a relatively high resistance due to an insulating fault in the multi-layering scheme. This insulating fault is considerably hard to detect by the aforementioned testing method. Our investigations have revealed a problem that the insulating fault is detected as a margin fault at the time when the product comes into the market and is installed in a system.

An object of the present invention is to provide a semiconductor memory device which is given by a simple construction a testing Function to accurately detect even a light short-circuit due to an insulating fault between a word line and a power line.

The other objects and novel features of the present invention will become apparent from the following description to be made with reference to the accompanying drawings.

The summary of a representative of the invention to be disclosed herein will be briefly described in the following. Specifically, the present invention is equipped with a test circuit comprising: a plurality of MOSFETs having their individual gates connected with a plurality of word lines in a memory array; and a testing pad for detecting tile presence of an electric current flowing between the sources and drains of the plurality of MOSFETs.

By the current measurement at the testing pad, according to the above-specified means, the presence of a short-circuit can be accurately detected in terms of a current Flowing through tile MOSFET. Namely, if a word line and a power supply are short-circuited the potential at the gate of the MOSFET will have increased to an intermediate value exceeding the threshold voltage of the MOSFET which, therefore, results in a current flowing therethrough.

BRIEF DESCRIPTION OF THE DRAWINGS

FIG. 9 is a diagram showing a chip layout of one embodiment of the static RAM according to the present invention;

DESCRIPTION OF THE PREFERRED EMBODIMENTS

An overall construction of a static RAM to which is applied the present invention will be described in the following.

Figure 7:
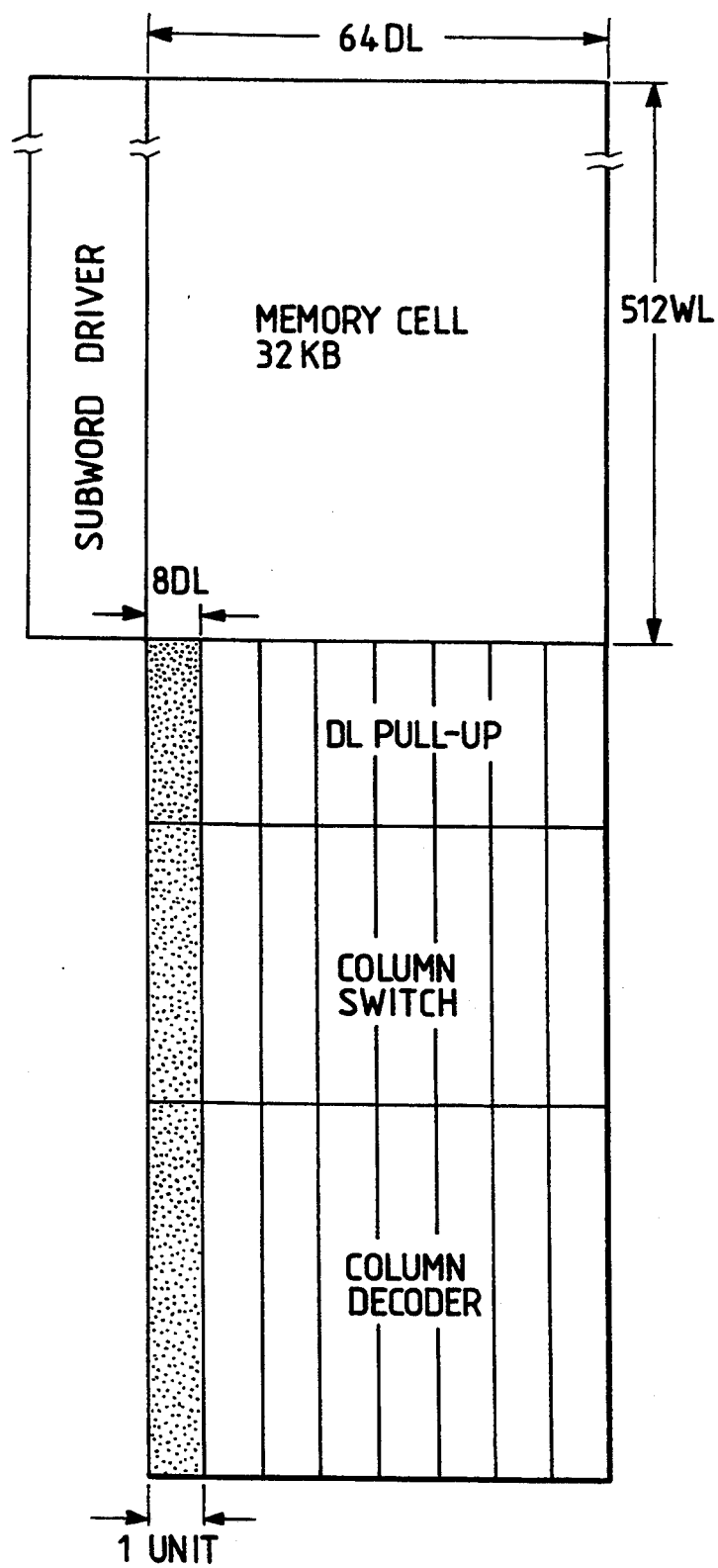
FIG. 7 is a diagram showing a Layout of one memory mat (or memory block) in the static RAM according to the present invention.

FIG. 7 is a diagram showing a layout of one memory mat. In accordance with this memory mat layout scheme, there are provided 512 word lines, as designated at WL0 to WL511, although not especially limited thereto. A memory array corresponding to one unit has a storage capacity of 8×512. As shown, one memory mat is constructed of eight units. Thus, one memory mat has a storage capacity of 8×8×512 (i.e., about 32 Kbits). A DL (data line) pull-up circuit acting as a data line load is interposed between a column switch and a memory cell array, and a column decoder is disposed below the column switch.

The 512 word lines of the memory mat are selected by a subword driver, although not especially limited thereto. Specifically, the subword driver brings one of the 512 word lines into a selected state in response to both a select signal from a global word line and a select signal of a column corresponding to that memory mat. Hence, the word lines to be coupled to the memory cells can be called the local word lines, as differentiated from the global word lines.

In the construction described above, the column selections are carried out at each unit. Thus, the RAM is subjected to a memory access at the unit of 8 bits. Incidentally, if a selector is provided for common data lines (or input/output lines) provided through the column switch so that it may be able to select half of eight pairs of common data lines, an access from the outside of the RAM can be carried out at the unit of 4 bits. If only one pair of common data lines is selected, an access from the outside can be carried out at the unit of 1 bit. This switching of the memory accesses can be achieved by a selective supply of potentials such as the supply voltage at the earth potential of the circuit to a bonding pad to be used as memory means.

Figure 8:
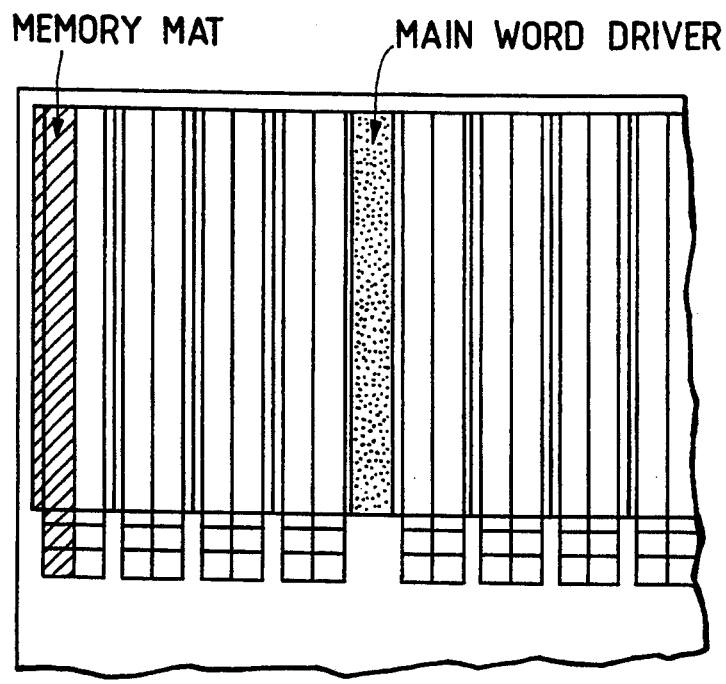
FIG. 8 is a diagram showing a layout of one embodiment of a memory mat around a main word driver in the static RAM according to the present invention.

FIG. 8 is a diagram showing a layout of the relation between the main word driver and the memory mats. Eight memory mats are arranged each of both sides of the main word driver. As a result, one main word driver takes charge of the word line selection corresponding to 32 K×16 bits (i.e., about 512 Kbits). FIG. 9 is a diagram showing the layout of the whole chip. Since there are arranged eight main word drivers, as shown, the whole chip is given a storage capacity of about 4 Mbits.

The chip is generally shaped into a rectangle and is equipped with indirectly peripheral circuits or terminals at its longitudinally central portion. In other words, the connection of the chip with the bonding pad is carried out by the well-known LOC technology. Although not shown because of no direct relation to the present invention, the chip is equipped, for example, with a pair of leads extending along the longitudinally central portion, and pluralities of power pads and earth potential pads. Thus, the chip is supplied with the earth potential (VCC=0 V) of the circuit or the supply voltage VEE from a plurality of portions by a wiring material having a low resistance such as the lead frame, the power impedance of the circuit supplied with that potential can be suppressed to a low value. As a result, it is possible to suppress the noises which are generated in the power lines or the earth line by the operating current of the circuit and to increase the operation margin of the internal circuit or the level margin of the input signals from the outside.

Address inputting bonding pads and control inputting bonding pads are also arranged like before at the central portion of the chip, and peripheral circuits such as address buffers, predecoders and control circuits are accordingly arranged in their vicinities. According to this construction, the signal lines can be extended generally radially from the central portion of the chip so that the substantial signal propagation distance can be shortened as much as about one half of the chip size. The wiring resistance of the signal lines will increase in proportion to the wiring length so that the wiring capacity will also increase in proportion to the wiring length. This means that the signal propagation delay will increase on principle in proportion to the square of the signal propagation distance. As a result, the signal propagation delay can be reduced to one quarter by shortening the signal propagation distance substantially to one half.

Figure 1:
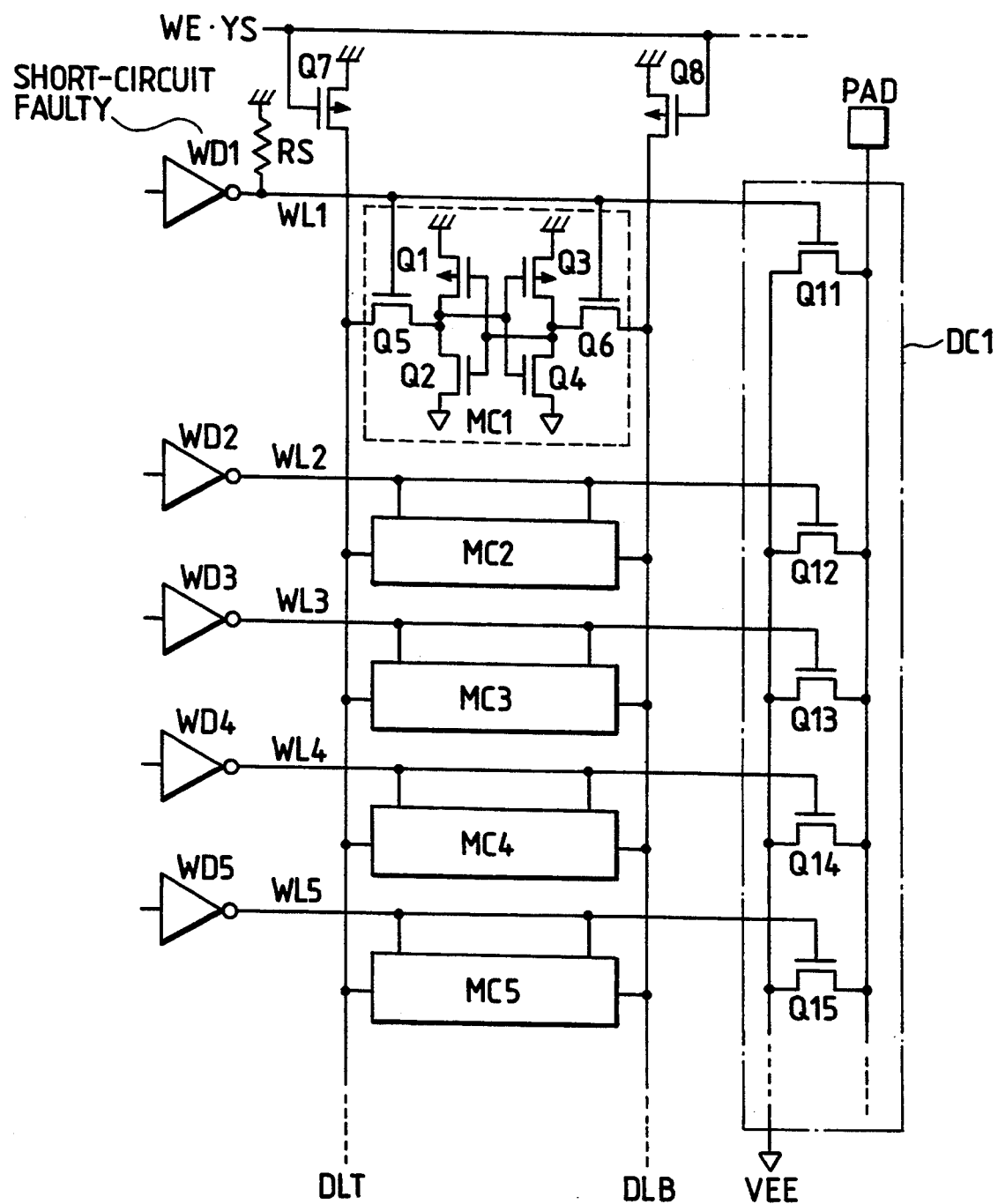
FIG. 1 is a circuit diagram showing an essential portion of one embodiment of a static RAM according to the present invention.

FIG. 1 is a circuit diagram showing an essential portion of one embodiment of the static RAM according to the present invention. The memory cell array of FIG. 1 is equipped, by way of example, with a pair of complementary data lines DLT and DLB, local word lines WL1 to WL5, and memory cells disposed at the intersections of the former lines.

At the intersections between the complementary data lines PET and DLB and the local word lines WL1 to WL5, as illustrated, there are disposed static memory cells MC1 to MC5. Each static memory cell is constructed, as specified in the memory cell MC1, of: a memory portion constructed as a regenerative latch (e.g., flip-flop circuit) which includes cross-coupling of the inputs and outputs of a pair of CMOS inverters including P-channel type MOSFETs Q1 and Q3 and N-channel type MOSFETs Q2 and Q4; and N-channel type transmission gate MOSFETs Q5 and Q6 connected between the input/output terminals and the complementary data lines DLT and DLB. The transmission gate MOSFETs Q5 and Q6 have their gates connected with the local word line WL1.

The P-channel type MOSFETs Q1 and Q3 are considerably different from the P-channel type MOSFETs in an ordinary CMOS circuit. That is, the P-channel type MOSFETs Q1 and Q3 constituting the memory portion may be given such a minute current supply ability that the data latched in the gate capacitances of the N-channel type MOSFETs Q2 and Q4 may not be lost by the drain leak current or the like of the MOSFETs. Therefore, the P-channel type MOSFETs Q1 and Q3 have their sources and drains formed by making use of a poly-silicon layer. This construction, in which the P-channel type MOSFETs are formed in the poly-silicon layer, can reduce the cell size because the P-channel type MOSFETs Q1 and Q3 need not be isolated by an element isolation region from the N-channel type MOSFETs Q2 and Q4 unlike the case in which the P-channel type MOSFETs are formed over the semiconductor substrate. In other words, a storage capacity as high as the aforementioned 4 Mbits can be realized.

The memory cell may use a poly-silicon high resistor in place of the P-channel type MOSFETs Q1 and Q3. In case, however, the poly-silicon high resistor is used, a DC current will steadily flow between The poly-silicon high resistor and the memory MOSFET in the ON state. This poly-silicon high resistor will allow such a minute current to flow as can compensate the drain leakage current of the MOSFET. In the RAM intended to have a storage capacity as high as about 4 Mbits as in the present embodiment, the aforementioned leakage current cannot be ignored; therefore the CMOS construction is more advantageous in view of the relatively low power consumption associated therewith.

The static RAM of the present embodiment has its circuit constructed by the four-layer poly-silicon wiring technology. For example: the first poly-silicon layer is used For the gate electrodes of the N-channel type MOSFETs Q2 and Q4 as the memory MOSFETs; the second poly-silicon layer is used for the gate electrodes of the N-channel type MOSFETs Q5 and Q6 as the transmission gate MOSFETs; the third poly-silicon layer is used For the gate electrodes of the P-channel type MOSFET Q1 and the N-channel type MOSFET Q2; and the fourth poly-silicon layer is used as the source, drain and channel of the P-channel type MOSFET Q1 and the N-channel type MOSFET Q2. And, the second poly-silicon layer constitutes the gate electrodes of MOSFETs Q11 and Q15 to be used in a later-described detector DC1.

The complementary data lines DLT and DLB are equipped with P-channel type MOSFETs Q7 and Q8 as data line loads or data line pull-up circuits. These P-channel type MOSFETs Q7 and Q8 are turned OFF if the complementary data lines are selected in a write mode in response to a write signal WE and a column select signal YS.

By adopting the aforementioned construction in which the load MOSFETs Q7 and Q8 are arranged in the vicinity of the column switches, as shown in FIG. 7, the load MOSFETs Q7 and Q8 and so on can be easily controlled by making use of the output signals of the decoder for producing select signals to be fed to the column switches. Specifically, the load MOSFETs Q7 and Q8 corresponding to the complementary data lines DLT and DLB for the actual writing operations can be turned OFF by feeding the write enable signal WE and so on instructing the writing operations to the column decoders and combining it with the aforementioned column select signal.

As a result, one of the load MOSFETs Q7 and Q8 is used for each of the complementary data lines DLT and DLB, and its conductance is set to a relatively high value, while considering the reading operation only, to limit the signal amplitude at the reading time thereby to speed up the reading operation. Thus, the writing operation can be carried out at a high speed by turning OFF the load MOSFETs Q7 and Q8. Moreover, since the load MOSFETs Q7 and Q8 can have their conductances set to the relatively high value, as described above, the reading operation after the writing operation can also be carried out at a high speed without providing any special write recovery circuit.

The subword drivers WD1 to WD5 produce the select signals of the local word lines WL1 to WL5. The sub-word drivers WD1 to WD5 drive the local word lines WL1 to WL5 in response to select signals which are produced by the logic gate circuits made receptive of the select signals transmitted From the global word lines and the select signals corresponding to the memory mats. The logic gate circuit portion and the driver portion may be integrally constructed.

In the present embodiment, there is provided the following test circuit for detecting the presence of a short-circuit fault through a resistor RS due to an insulating Fault between tile local word line WL1 and the supply voltage VCC (at the earth potential). The RAM of the present embodiment has its input/output interface given an interchangeability with the ECL level, although not especially limited thereto. Therefore, the supply voltage VEE is set to a negative voltage of about −4.5 V, and the supply voltage VCC is set to the earth potential of the circuit.

The test circuit described above includes the detection circuit DC1 including the N-channel type MOSFETs Q11 to Q15. The local word lines WL1 to WL5 are individually connected with the gates of the N-channel type MOSFETs Q11 to Q15. These MOSFETs Q11 to Q15 have their sources fed commonly with the supply voltage VEE and their drains connected commonly with a testing pad PAD. The N-channel type MOSFETs Q11 to Q15 used are the MOSFETs having tile same construction as that of the transmission gate MOSFETs in the memory cell, although not especially limited thereto. Specifically, both the N-channel MOSFET Q11 to Q15 and the transmission gate MOSFETs Q5 and Q6 of the memory cells have their gates connected with the word lines respectively. Therefore, in case the gates of the transmission gate MOSFETs Q5 and Q6 are formed of a second poly-silicon layer SG as in the foregoing embodiment, the gate of the corresponding MOSFET Q11 is also formed of the second poly-silicon layer SG. And, a similar connection is made to the local word line WL1 which is Formed of a third poly-silicon layer TG.

The aforementioned short-circuit fault is detected in the following manner by the test circuit of the present embodiment. In the RAM completed over the semiconductor wafer, a probe is applied at a probing step to the testing pat PAD to test whether or not electric currents will flow through the MOSFETs Q11 to Q15. In an unselected memory mat, all the local word lines are set to the unselected low level. If, however, there occurs the aforementioned short-circuit fault, the potential of the local word line WL1 is given an intermediate level by the resistance division of the output impedance of the subword driver WD1 and the aforementioned short-circuit resistor RS. If the intermediate level of the local word line WL1 exceeds the threshold voltage of the MOSFET Q11, an electric current corresponding to the voltage level flows through the MOSFET Q11. This current can be detected by an ammeter which is connected through the probe applied to the testing pad PAD. Alternatively, a voltage signal, which is obtained to correspond to a fixed resistor and the ON resistance of the MOSFET Q11 when a predetermined voltage is fed by the probe through the fixed resistor, is detected by a voltmeter. Since this voltage signal changes with the degree of conduction of the MOSFET Q11, the resistance of the short-circuit resistor RS of the local word line WL1 can be indirectly detected.

Figure 14:
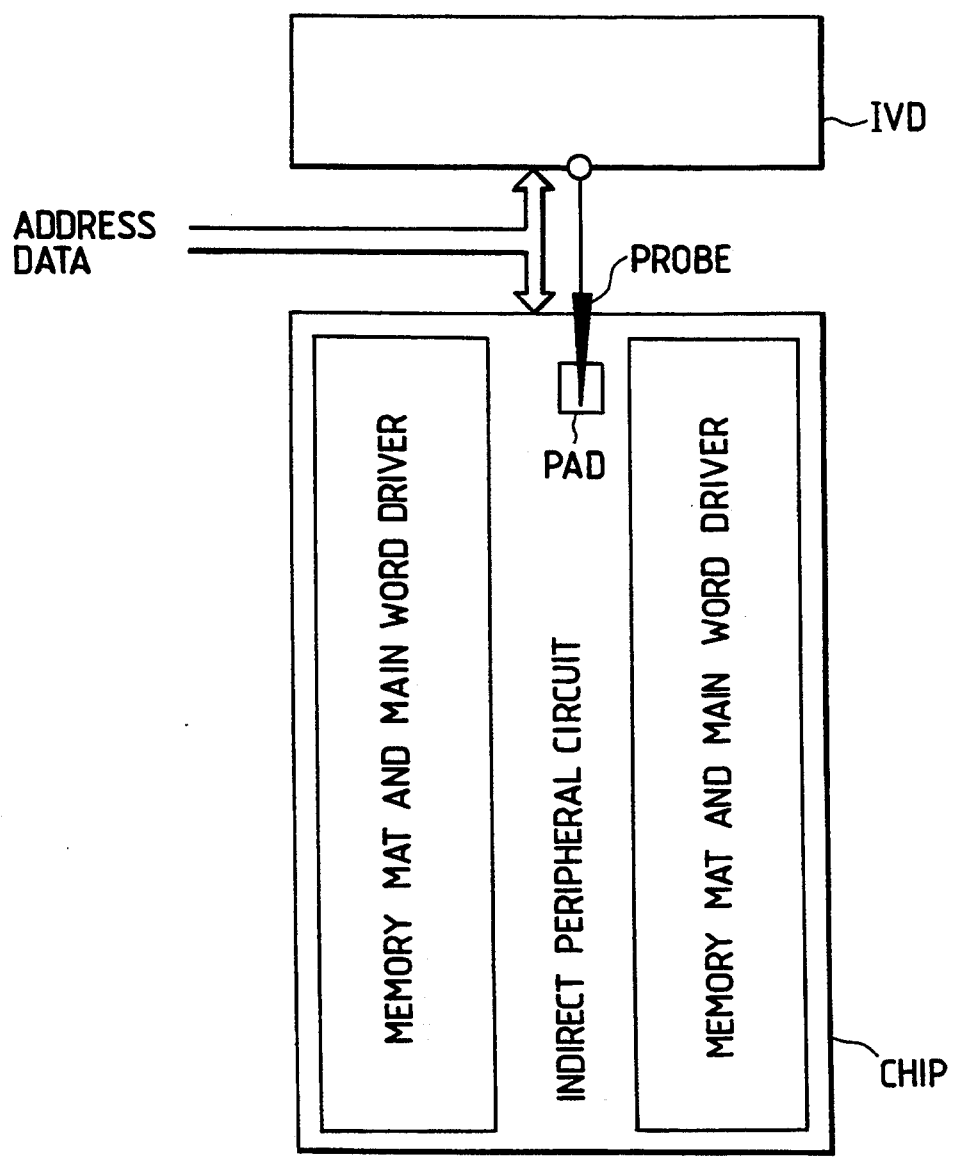
FIG. 14 is a connection diagram showing a semiconductor memory device and a current or voltage detector according to the present invention.

FIG. 14 is a connection diagram of the semiconductor memory device and the current/voltage detector according to the present invention. This current/voltage circuit IVD is operated to detect the current or voltage signal obtained from the testing pad, i.e. by applying the probe to the testing pad formed on the chip. The testing pad may be provided in each of the memory mats, and its number is not limited. Moreover, the current/voltage detector IVD is commonly fed with the address data like the aforementioned chip and is used to discriminate a local word line which has a short-circuit fault.

Figure 2:
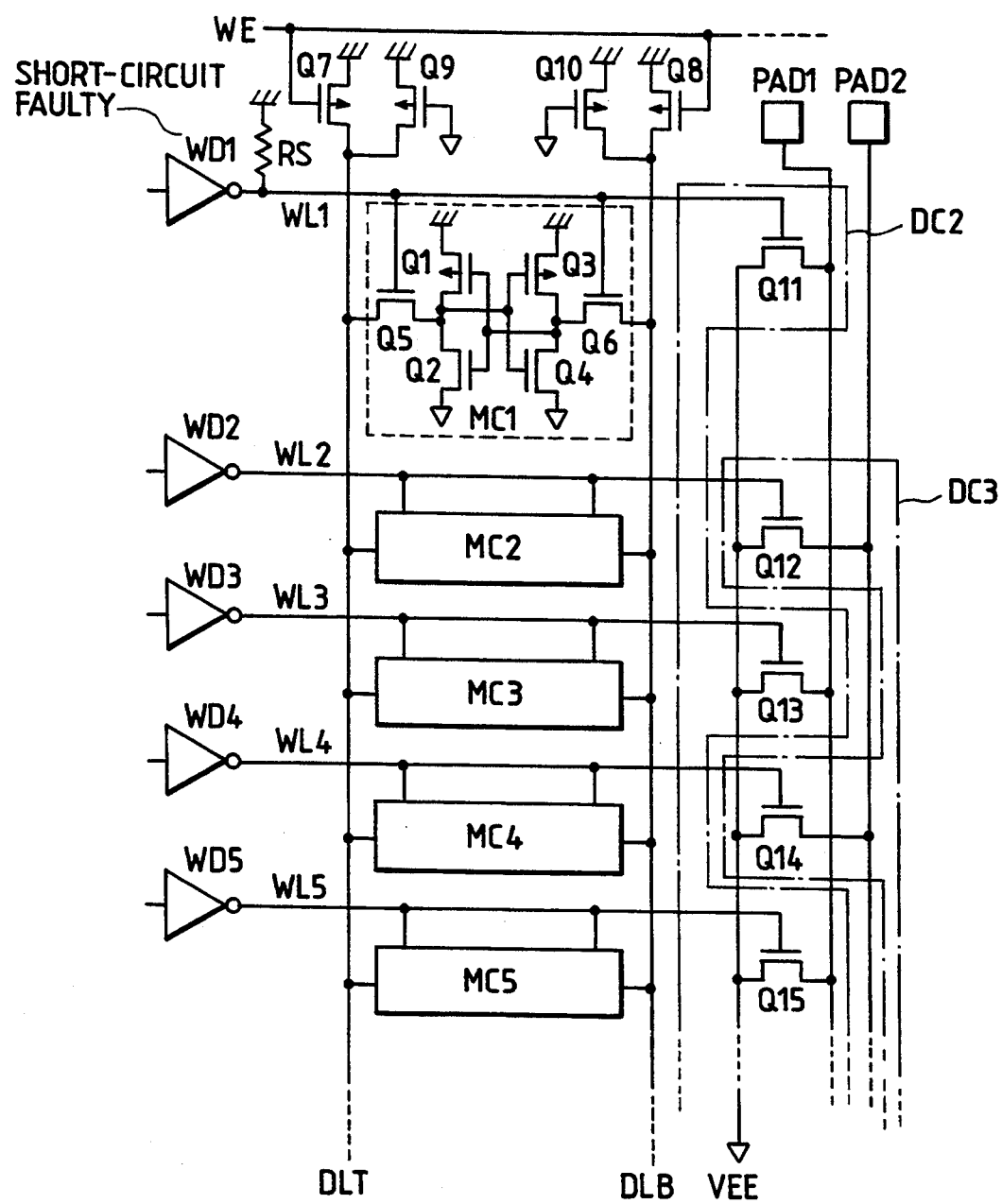
FIG. 2 is a circuit diagram showing an essential portion of another embodiment of the static RAM according to the present invention.

FIG. 2 is a circuit diagram showing an essential portion of another embodiment of the static RAM according to the present invention. In the present embodiment, the testing pad is divided into pads PAD1 and PAD2 so that the MOSFETs Q11 and Q12, and Q13 and Q14 corresponding to the adjoining local word lines, such as the local word lines WL1 and WL2, and WL3 and WL4 may, not constitute an identical wired OR. In other words, the local word lines WL1 to WL5 are divided into those arranged as an odd ordered group and those arranged as an even ordered group, and the MOSFETs Q11 to Q15 are connected in parallel in a corresponding manner. In short, the odd MOSFETs Q11, Q13 and Q15 are associated with a detector PC2 having the wired OR construction and corresponding to the testing pad PAD1, and the even MOSFETs Q11, Q18 and Q15 are associated with a detector PC3 having the wired OR construction and corresponding to the testing pad PADS.

According to this construction, it is possible to detect not only the case, in which the local word lines are short-circuited with the supply voltage VCC, as described above, but also the short-circuit fault between the adjoining local word lines WL1 and WL2. Specifically, the current/voltage detector IVD is connected with the testing pad PAD1, for example, and the local word lines WL2 and WL4 associated with the even ordered group of local word lines are sequentially brought into the selected states. As a result, if a short-circuit fault occurs between the local word lines WL2 and WL1, the local word line WL1, which should be unselected due to the short-circuit fault when the local word line WL2 is selected, also takes the aforementioned intermediate level, as described above, so that the electric current flows through the MOSFET Q11. This current can be detected by the current/voltage circuit IVD which is connected with the testing pad PAD1.

The short-circuit fault between the local word lines WL1 to WL5 and the supply voltage VCC can be detected by accomplishing the aforementioned current or voltage detection using the two testing pads PAD1 and PAD2. This detection can discriminate which one of the even or odd orders the short-circuit Fault has occurred in. This fault data can be utilized for the analysis of the fault due to the layout design of the local word lines or the like.

In the present embodiment, the load circuit to be attached to the complementary data lines DLT and DLB includes two P-channel type MOSFETs Q7 and Q9, and Q8 and Q10. Of these, the MOSFETs Q9 and Q10 are steadily turned ON if their gates are fed with the supply voltage VEE. These MOSFETs Q9 and Q10 are given a relatively high resistance corresponding to the writing operation. On the other hand, the composed resistance of the MOSFETs Q7 and Q8 with the MOSFETs Q9 and Q10 connected in parallel therewith is set to a relatively low resistance corresponding to the reading operation. Those MOSFETs Q7 and Q8 are turned OFF for the writing operation when their gates are fed with the write control signal WE. According to this construction, the load MOSFETs Q7 to Q10 need not be disposed at the side of the column switches like before but can be arranged in arbitrary positions such as the complementary data lines DLT and DLB or apart from the column switches.

Figure 3:
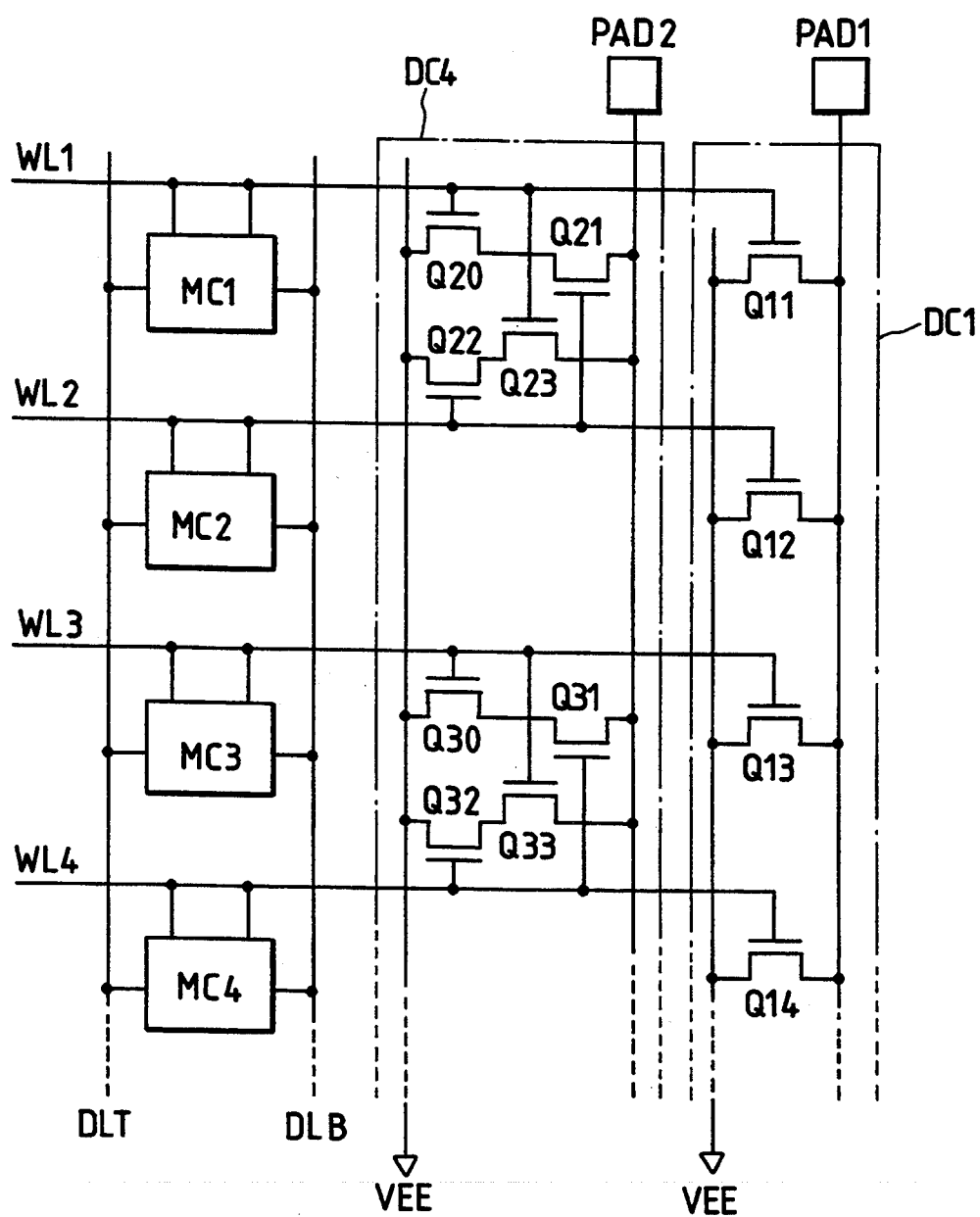
FIG. 3 is a circuit diagram showing another embodiment which a test circuit is incorporated into the static RAM according to the present invention.

FIG. 3 is a circuit diagram showing another embodiment of the test circuit to be incorporated into the static RAM according to the present invention. The test circuit of the present embodiment is given a function to specify the local word line on which the aforementioned short-circuit fault has occurred.

In order to detect the presence of the short-circuit fault, there are provided the MOSFETs Q11, Q12, Q13 and Q14 which have their gates connected with the local word lines WL1, WL2, WL3 and WL4, their sources fed with the supply voltage VEE and their drains equipped commonly with the testing pad PAD1.

The following circuit is provided For discriminating whether or not the short-circuit fault has occurred on any of tile local word lines in case the short-circuit fault is detected by the aforementioned detector DC1 having the aforementioned wired OR construction of the MOSFETs Q11, Q12, Q13 and Q14. There is provided a detector DC4 which includes two pairs of series-connected MOSFETs, including N-channel type MOSFETs Q20 and Q21, and Q22 and Q23 between a pair of adjacent local word lines WL1 and WL2. Each such pair of MOSFETs have their gates connected with the adjoining two local word lines WL1 and WL2 respectively. The MOSFETs Q20 and Q22 have their sources connected with the supply voltage VEE and their drains connected commonly with the testing pad PAD2. Similar groups of two pairs of series-connected MOSFETs are also provided at each of the other pairs of local word lines and connected commonly with the aforementioned testing pad PAD2.

In order to shorten the testing time, if it is decided that the short-circuit fault exists in the memory mat by using the MOSFETs Q11, Q12, Q13 and Q14 having the aforementioned wired OR construction and the testing pad PAD1, then the local word line having the short-circuit fault is found out by the following operations.

The local word lines in the memory mat are sequentially brought into the selected states. In case, at this time, the aforementioned paired local word lines WL1 and WL2 are normal, both of the MOSFETs Q20 and Q21, and Q22 and Q23 connected in series are not turned ON when either of the local word lines WL1 and WL2 is selected. As a result, no change in the current or voltage is detected in the current/voltage detector IVD which is connected through the probe with the testing pad PAD2.

In case a short-circuit fault occurs in the local word line WL1 of the aforementioned pair, the MOSFETs Q21 and Q22 having their gates connected with the local word line WL2 are turned ON when the local word line WL2 is selected. Then, the MOSFETs Q20 and Q23 are also turned ON in response to the instant when the local word line WL1 to be left unselected and held at the low level is caused to take the intermediate level by the short-circuit fault. As a result, the current according to the short-circuit state of the local word line WL1, that is, corresponding to the intermediate level due to the short-circuit fault of the local word line WL1 will flow through the series circuit of the MOSFETs Q20 and Q21, and Q22 and Q23. Thus, it is possible to discriminate the short-circuit fault due to the change in the current or voltage in the testing pad PAD2. Since, at this time, the current or voltage is changed in the testing pad PAD2 by selecting the local word line WL2, it is found that the short-circuit fault has occurred in the local word line WL1 making a pair with the local word line WL2.

The MOSFETs Q11, Q12, Q13 and Q14 of the aforementioned sired OR construction can be omitted. Even with no short-circuit Fault on the local word lines, however, it cannot be found that the short-circuit fault is absent unless the local word lines are selected one by one in tile memory mat. This makes it impossible to decide the presence of the short-circuit fault unless the local word lines are sequentially selected one by one in the whole RAM, so that the testing time is elongated. On the contrary, the presence of the short-circuit fault can be decided for a remarkably short time if the MOSFETs of the aforementioned wired OR construction is provided. Since the word line selections for detecting the aforementioned short-circuited portions may be accomplished only for the short-circuited RAM, the testing time can be shortened.

Figure 4:
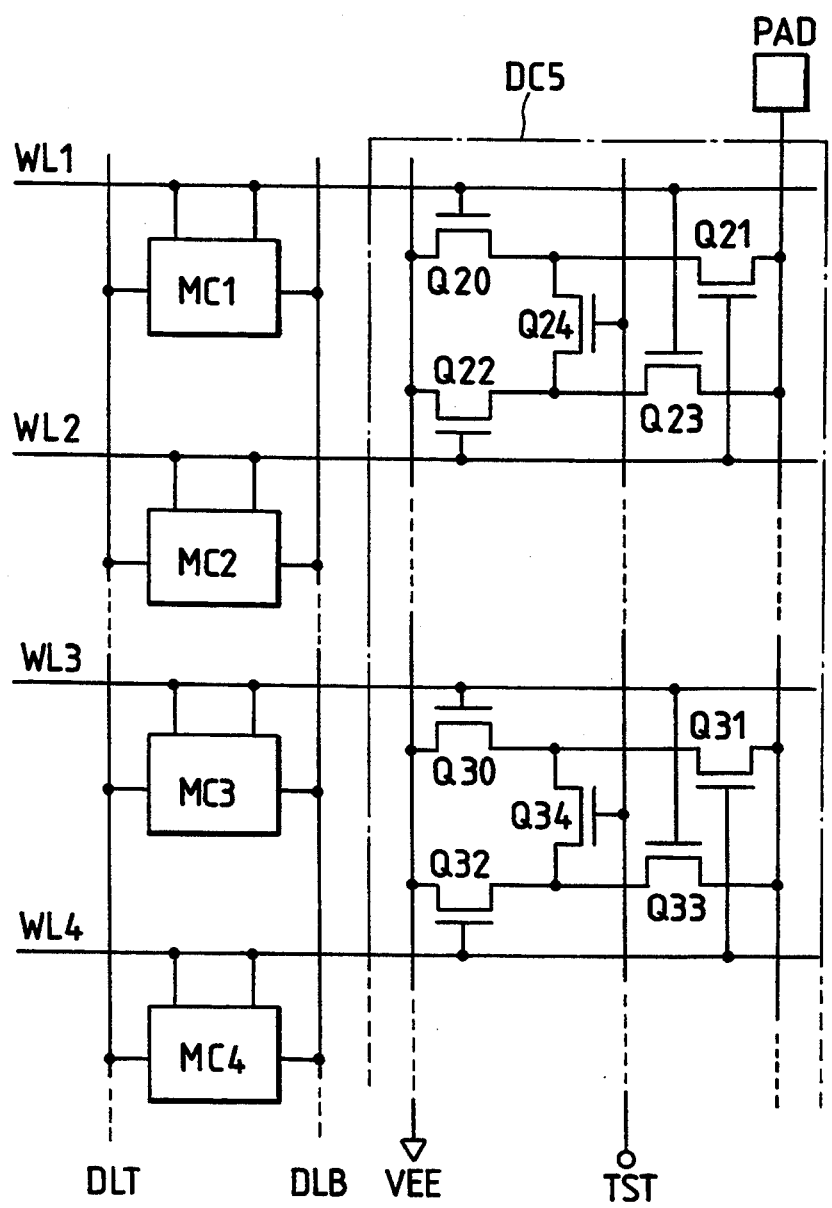
FIG. 4 is a circuit diagram showing another embodiment of the test circuit to be incorporated into the static RAM according to the present invention.

FIG. 4 is a circuit diagram showing a further embodiment of the test circuit to be incorporated into the static RAM according to the present invention. The test circuit of the present embodiment is given the function to specify the local word line having been short-circuited, as described above, and the number of testing pads is reduced to one. Specifically, in the present embodiment, the one testing pad PAD provided can detect the presence of the short-circuit fault of the plurality of local word lines in the memory mat, altogether, and can specify the local word line having been short-circuited.

There is provided a detector DC5 which has a MOSFET Q24 connected with the intersections of the N-channel type MOSFETs Q20 and Q21, and Q22 and Q23 having their gates connected in series with the paired two local word lines WE1 and WE2 adjoining each other. The MOSFET has its gate shared with the gate of a similar MOSFET of a test circuit disposed in the local word line of another pair and fed with a testing control signal TST.

In the present embodiment, the test control signal TST is set to the high level when a testing operation is being made of whether or not the short-circuit fault is present in any of a plurality of local word lines in the memory mat. As a result, the MOSFET Q24 is turned ON. In this state, all the local word lines in the memory mat are brought into the unselected states. If the local word line WL1 should be short-circuited, for example, to take the intermediate level, the MOSFETs Q20 and Q23 are turned ON. As a result, a DC current path of the MOSFETs Q23 - Q24 - Q20 is established between the testing pad PAD and the supply voltage VEE. Thus, the presence of the short-circuit fault can be discriminated by detecting the presence of such current by the current/voltage detector IVD connected with the testing pad PAD.

If the short-circuit fault is detected, the test control signal TST is set to the low level to turn OFF the aforementioned MOSFET Q24. Then, the circuit takes a state similar to that of the foregoing embodiment of FIG. 3. Therefore, the local word lines are sequentially brought one by one into the selected states, and the presence of the current through the aforementioned series MOSFETs is Judged by the current/voltage detector IVD connected with the testing pad PAD so that the local word line having the short-circuit fault is decided from the address data of this time.

The aforementioned test circuit can be formed by making elements corresponding to one memory cell by one column in the memory mat. Specifically, the memory cells are improper as the switch MOSFETs if the P-channel type MOSFETs are formed in the poly-silicon layer, as described above, so that four N-channel type MOSFETs can be exploited for one cell. Even in the test circuit for specifying the local word line having the short-circuit fault, therefore, the aforementioned test circuit can be produced merely by adding the circuit for one memory cell because only three MOSFETs are used for one local word line even in the embodiment of FIG. 3. In the embodiment of FIG. 4, the test circuit can be constructed of totally five MOSFETs in one pair of local word lines.

The aforementioned specification of the local word line having the short-circuit fault has a close relation to the relieving circuit of a defective word line. If the memory access or the local word line having the short-circuit fault is detected by specifying the local word line, the operation can be switched to the selection of a reserve local word line in place of the defective one. If what is done is to detect the presence of the short-circuit fault of the local word lines, the RAM having the short-circuit fault is abandoned, or the entirety of the memory mat having the short-circuit fault is left unaccessed so that it can be used as one having a small storage capacity. On the other hand, if the function capable of specifying the short-circuit fault is added, a reserve local word line is provided. Then, a relief can be achieved by selecting the reserve one if an access to the defective word line is detected.

Figure 5:
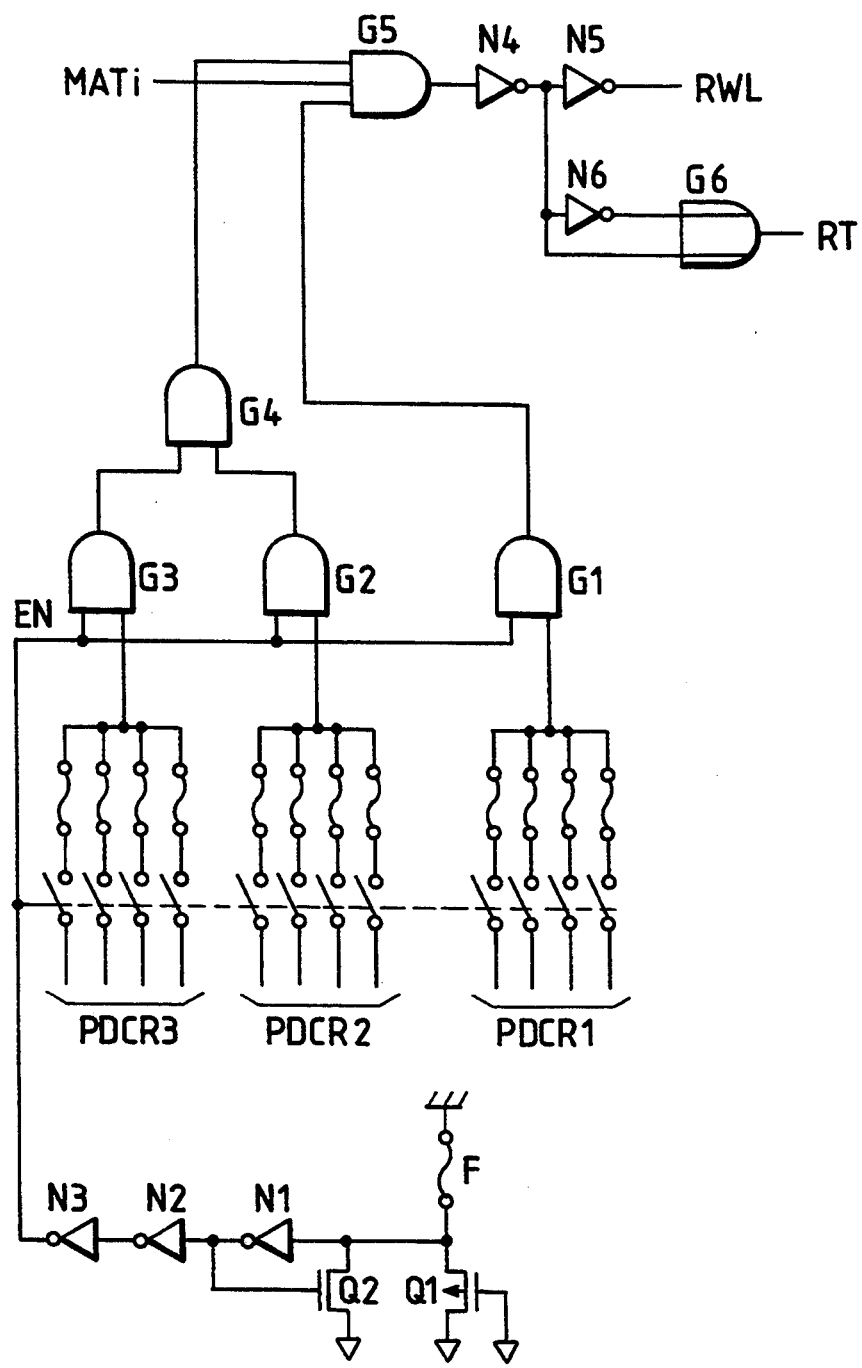
FIG. 5 is a circuit diagram showing one embodiment of a decoder to be incorporated into a redundancy circuit according to the present invention.

FIG. 5 is a circuit diagram showing one embodiment of a decoder to be incorporated into a redundancy circuit. Although the circuit symbols attached to the circuit elements of FIG. 5 are partially common with those of FIG. 1, it should be understood that they have different circuit functions.

The redundancy circuit is activated by cutting fuse means F. A P-channel type MOSFET Q1 is connected in series with the fuse means F. The MOSFET Q1 is steadily turned ON to act as a resistance element if its gate is steadily fed with the supply voltage VEE. Unless the fuse means F is cut, the resistance in the ON state of the MOSFET Q1 is given a far higher resistance than that of the fuse means F so as to reduce the DC current flowing through the fuse means F and the MOSFET Q1 and to set the signal to the high level when the fuse means F is not cut.

If the fuse F is cut, an output signal at the low level is produced. This low level signal if latched by a latch circuit which includes an inverter N1 and a MOSFET Q2 connected with the input of the inverter N1. Specifically, once the low level signal is fed, the output signal of the inverter N1 is set to the high level to turn ON the MOSFET Q2 so that the input signal, of the inverter N1 is fixed at the low level in response to the ON state of the MOSFET Q2. The output signal of the inverter N1 is used as an enable signal EN which is to be outputted through inverters N2 and N3 to activate the redundancy circuit.

NAND gate circuits G1 to G3 to be fed with predecode output signals corresponding to the address of a deflective local word line are fed with the output signals of three divided predecode circuits PDCR1 to PDCR3 through the switches and the fuse means. Of the Four fuse means corresponding to the output signals of each of the predecode circuits PDCR1 to PDCR3, the three ones are cut while leaving one corresponding to the defective local word line. The address is stored by cutting such fuse means.

In order to prevent the conflict among the aforementioned predecode outputs with the fuse means for the defective address storage being uncut, the switches are connected with the inputs thereof. This switch is constructed, like the column switch as the selector of the complementary data lines, of a CMOS switch circuit which has an N-channel type MOSFET and a P-channel type MOSFET connected in parallel, although not especially limited thereto. This CMOS switch is controlled by the aforementioned control signal EN. When the aforementioned fuse means F is not cut, the control signal EN takes the low level to turn OFF all the switches. As a result, the individual predecode outputs are prevented from conflicting through the defective address storing fuse means.

in case the redundancy circuit is used for the defect relief, the Fuse means F is cut to set the control signal EN to the high level. As a result, the aforementioned switches are turned ON. At this time, all the fuse means other than one means for the individual predecode outputs are cut so that the access to the defective address is detected together with the address storage. The switches may also be connected with the outputs (i.e., the common junctions) of the fuse means.

In the present embodiment, the predecode outputs are divided into three groups each having four outputs. Therefore, decode outputs of $4 \times 4 \times 4 = 64$ kinds are covered. In case Five hundreds and twelve local word lines are present as in the memory mat of the foregoing embodiment, the predecoder circuits may be divided into Four, e.g., $8 \times 4 \times 4 \times 4 = 512$. This construction is enabled to realize the functions to store the defective address and to compare the addresses by the twenty fuse means and a smaller number of logic gates. This construction may be modified into another, in which the defective address is stored by nine fuse means corresponding to an address of 9 bits for the selection of 1/512 so that the stored address and the inputted address may be compared by a coincidence/incoincidence circuit. This construction can reduce the number of fuse means to about one half but requires a number of elements for the memory circuit and the address comparator and the passages through a number of logic gates for the compared result so that the operation speed is dropped.

The signals having passed through the aforementioned fuse means are used for comparing the addresses in the AND gate circuits G1 to G5. In the present embodiment, the AND gate circuit G5 is fed with a mat select signal MATi. As a result, when the memory mat is selected and when all the combinations of the predecode outputs are at the logic 1, the memory access for the defective local word line is detected, and a reserve local word line RWL is selected through an inverter N4 and an inverter N5 acting as a local word driver. Moreover, the output signal of the inverter N4 and the output signal of an inverter N6 are fed to an OR gate circuit G6 to a reset signal RT. This reset signal RT is used to set the defective local, word line forcibly to the low level by the action of the following circuit.

Figure 6:
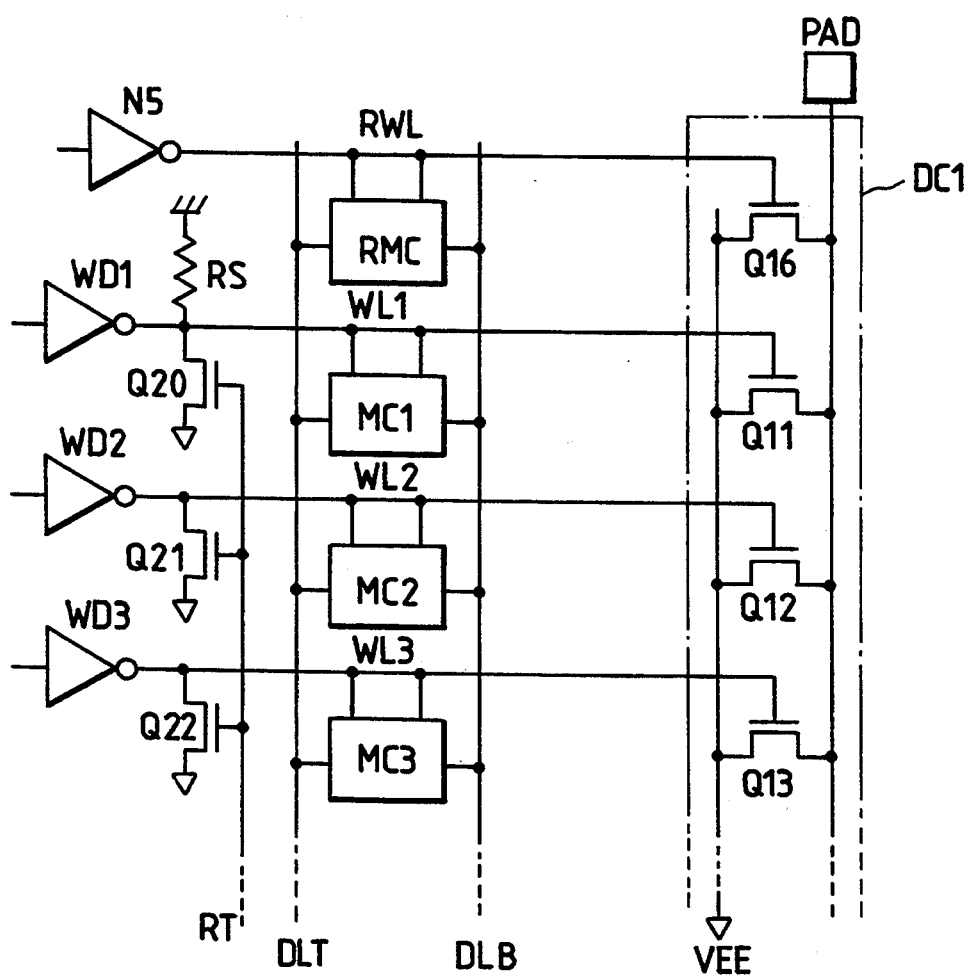
FIG. 6 is a circuit diagram showing one embodiment of a memory array unit corresponding to a defect relief.

FIG. 6 is a circuit diagram showing one embodiment of a memory array portion corresponding to the aforementioned defect relief.

For the aforementioned local word line, there is provided the reserve local word line RWL. This reserve local word line RWL is also connected like other local word lines with the memory cell MC. In order to detect that the reserve local word line RWL has not short-circuit Fault, there is additionally provided a MOSFET Q16 having the wired OR construction. Although not shown, a pair of reserve local lines may be provided and selected according to the test signal.

Between the individual local word lines WL1 to WL3 and the supply voltage VEE, there are connected the switch MOSFETs Q20 to Q22. These MOSFETs Q20 to Q22 have their gates fed with the aforementioned reset signal RT. As a result, the local word line WL1 having the short-circuit Fault is forcibly dropped to the low level, when the reserve local word line RWL is selected, to exert no influence upon the write/read operations of a reserve memory cell RMC. Moreover, if another local word line WL2 is selected, it is forcibly dropped to the low level in response to the high level of the inverter N4, to exert no influence upon the write/read operations of the memory cell. In other words, when a memory access to the same memory mat is carried out, the local word line having the short-circuit fault is forcibly dropped to the low level. Then, the memory cell is brought into a partially selected state in the local word line having the short-circuit fault so that it may not act to delay the write/read operations of the selected memory cell.

Figure 10:
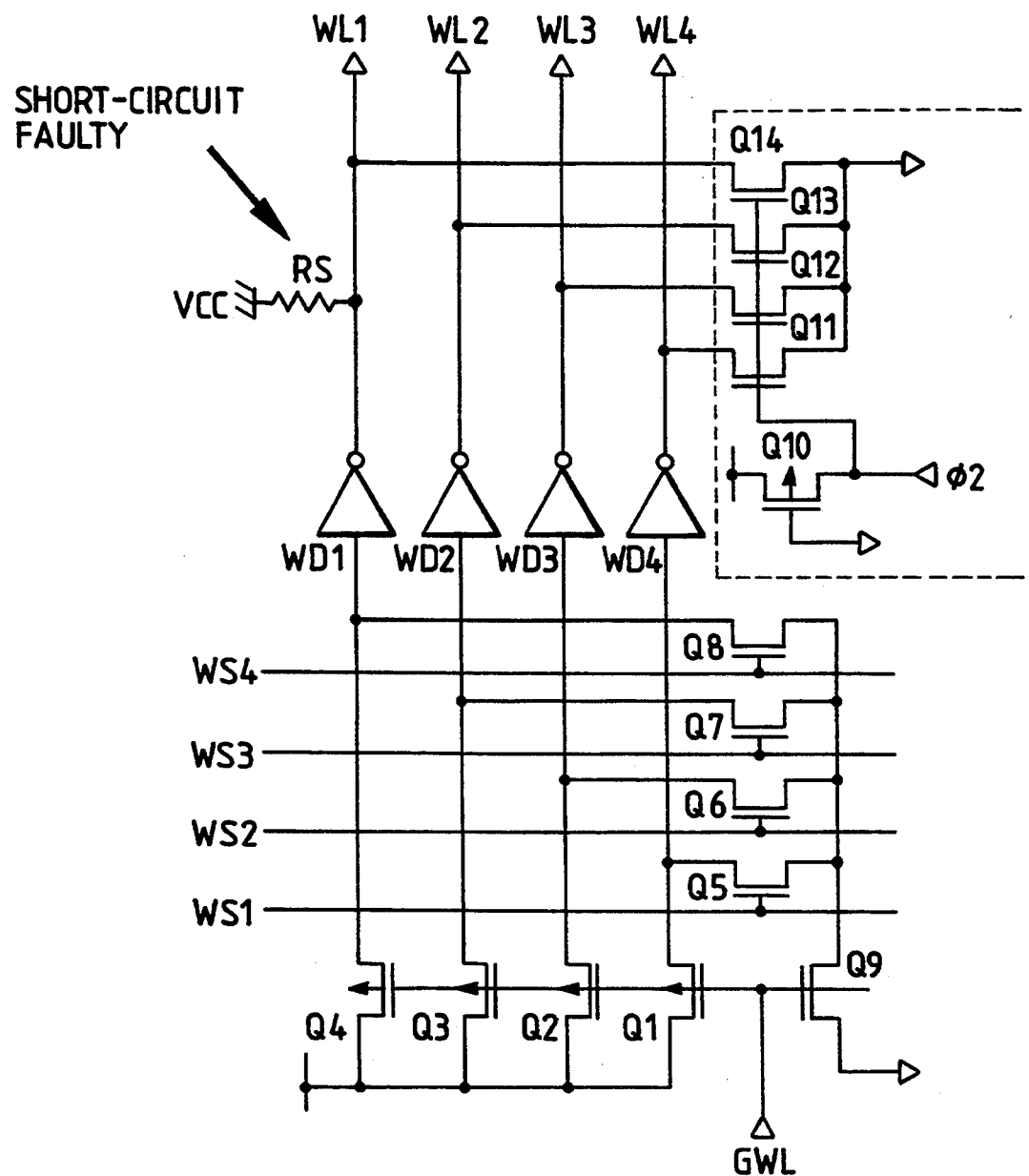
FIG. 10 is a specific circuit diagram of one embodiment of a local word line selector to be used in a semiconductor memory device according to the present invention.

FIG. 10 is a specific circuit diagram showing one embodiment of a local word line selector to be used in the semiconductor memory device according to the present invention.

In the present embodiment, one global word line GWL, is provided to correspond to the four local word lines WL1 to WL4 so as to simplify the circuit. The global word line GWL is connected with the gates of the P-channel type MOSFETs Q1 to Q4. With these P-channel type MOSFETs Q1 to Q4, there are individually connected in series N-channel type MOSFETs Q5 to Q8 which are made receptive of local word line select signals WS1 to WS4. These N-channel type MOSFETs Q5 to Q8 have their sources connected commonly with an N-channel type MOSFET Q9 which has its gate connected with the aforementioned global word line GWL.

According to this construction, if the global word line GWL is brought into a selected state at the high level, the P-channel type MOSFETs Q1 to Q4 are turned OFF, but the aforementioned N-channel type MOSFET Q9 is turned ON. And, any of the local word line select signals WS1 to WS4 is set to the high level to extract any of the input signals of local word drivers WD1 to WD4 to the low level. As a result, one of the four local word lines is brought into the selected state at the high level.

Between the local word lines WL1 to WL4 and the supply voltage VEE, there are connected N-channel type MOSFETs Q11 to Q14. These MOSFETs Q11 to Q14 have their gates fed with a cut signal $\phi 2$ of the fuse means of a global word line, as will be described in the following. Between the gates of those MOSFETs Q11 and Q14 and the earth potential of the circuit, there is connected a P-channel type MOSFET Q10. This MOSFET Q10 has its gate connected steadily with the supply voltage VEE to act as a pull-up resistance element.

Figure 11:
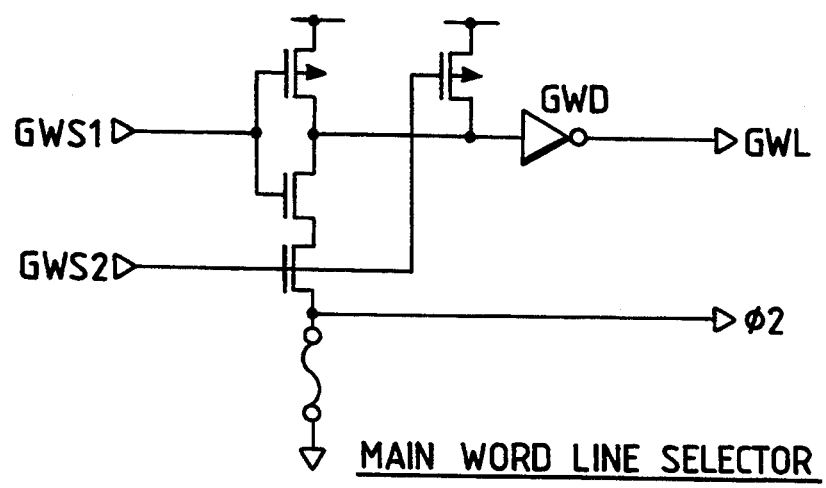
FIG. 11 is a specific circuit diagram showing one embodiment of a global word line selector to be used in the semiconductor memory device according to the present invention.

FIG. 11 is a specific circuit diagram showing one embodiment of a main (or global) word line selector to be used in the semiconductor memory device according to the present invention.

Global line select signals GWS1 and GWS2 are fed to a CMOS NAND gate circuit which includes a P-channel type MOSFET and an N-channel type MOSFET. The NAND gate circuit is Fed with the supply voltage VEE through fuse means. The output signal of the NAND gate circuit is inputted to a word driver GWD, by which the select signal of the global word line GWL is produced. The cut signal $\phi 2$ of the fuse means is produced from the junction between the fuse means and the N-channel type MOSFET constituting the NAND gate circuit.

If it is found by the test circuit described above that a short-circuit fault occurs in the local word line WL of FIG. 10, the corresponding fuse means of the global word line selector, as shown in FIG. 11, is cut. As a result, the supply voltage VEE is not fed to the NAND gate circuit for producing the global word line select signal so that the spare current consumption can be suppressed. In addition, the input signal of the word driver GWD is charged up to the high level in response to the low level of the global, word line select signal GWS1 or GWS2 which is produced at the time of each memory access, so that the global word line GWL is fixed at the substantially unselected low level. Thus, the global word line corresponding to the defective local word line is substantially isolated.

At the local word line selector including the local word line WL1 having The short-circuit fault, as shown in FIG. 10, all the inputs of the local word drivers WD1 to WD4 are set to tile high level to drop the local word lines WL1 to WL4 in response to the fixing the global word line GWL to the low level. The local word line WL1 having The short-circuit fault will take the intermediate level in accordance with the output impedance of the local word driver WD1 and the short-circuit resistor RS. In the present embodiment, the cut signal of the fuse means is set to the high level so that the switch MOSFETs Q11 to Q14 are turned ON. Thus, the local word line WL1 having the short-circuit fault can be forcibly set to the low level such as the earth potential.

The global word line thus isolated in circuit by the aforementioned short-circuit fault and the relating local word line are switched to their reserve circuit. Specifically, there are provided a reserve global word line and a local word line corresponding to each memory mat, and the address data of the global word line thus isolated by the fault are stored, so that the reserve global line may be selected when the memory access to that address is detected. For these address storage and address comparison, there can be used the fuse circuits, as shown in FIG. 5.

Figure 12:
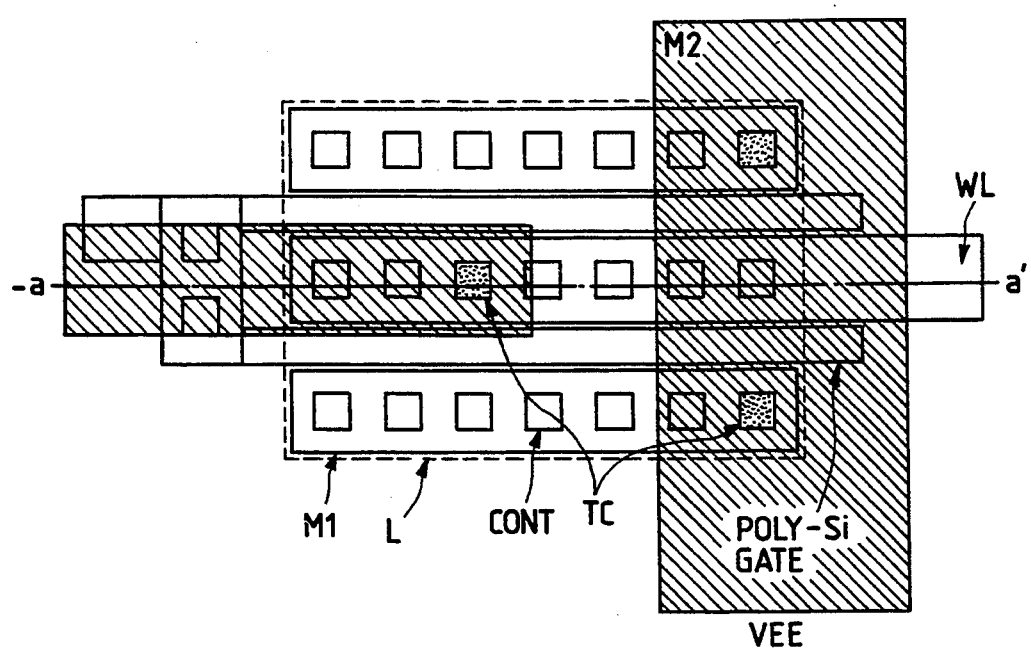
FIG. 12 is a diagram showing a schematic layout of one embodiment of the local word driver according to the present invention.
Figure 13:
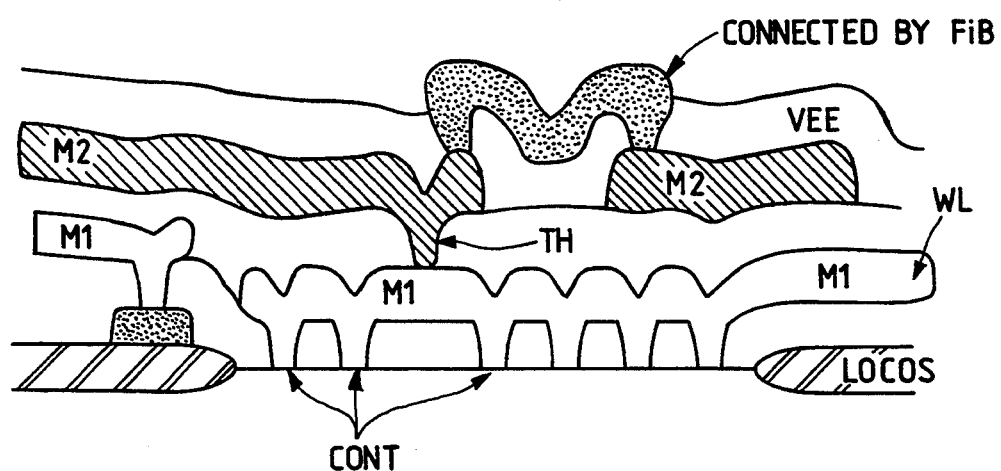
FIG. 13 is a section taken along line a—a' from the layout diagram of FIG. 12.

FIG. 12 is a diagram showing a schematic layout of one embodiment of a local word driver, and FIG. 13 is a section taken along line a—a' of FIG. 12. In the present embodiment, the construction, in which the word line having the short-circuit fault is forcibly set to the low level by the aforementioned switch MOSFETs Q11 to Q14, is replaced by another, in which the supply voltage or the low level of the circuit is fed directly to the local word line LWL having the short-circuit fault by the FiB technology.

Specifically, as shown in FIGS. 12 and 13, reference characters M1 designate a first metal layer which is used for constructing the local word line WL. This local word line WL is connected through a contact CONT with the drain of an N-channel type MOSFET which is formed in an element forming region surrounded by an element isolating region LOCOS to constitute a word driver. In the same Figures, the element structure itself constituting the word driver is omitted because it has no direct relation to the invention, but it should be understood that the contact CONT is formed with MOSFETs for constituting the word driver.

A metal layer M2, as hatched in the same Figures, is a second layer, and its righthand layer M2 is a supply line to be fed with the supply voltage VEE. The aforementioned local word line WL is connected with the drain of a not-shown P-channel type MOSFET through a contact hole TH (or a corresponding contact portion TC) and the second metal layer M2 formed in the lefthand side of the same Figures. By connecting those two metal layers M2 by the FiB technology, the supply voltage VEe is fed directly to the local word line WL having the fault. In the layout of FIG. 12, the wiring by the FiB technology is not shown so as to avoid the complicated pattern but is formed in the shortest portion of the hatched metal layer M2.

The aforementioned Fib technology is used in the prior art for connecting a circuit on trial in a semiconductor integrated circuit device being developed but is intended to be applied to a defect relief technology in the present embodiment. In short, the FiB technology is utilized to substantially isolate the aforementioned circuit having the short-circuit fault. According to this FiB technology, after a circuit is completed over a semiconductor wafer, an inter-layer insulating film is selectively etched off to form the wiring layer. In this construction, it is possible to omit the switch MOSFET For forcibly fix the potential of the local word line having tile short-circuit fault to the low level.

The effects to be attained From the foregoing embodiments are as follows:

(1) There is provided a test circuit including: a plurality of MOSFETs having their individual gates connected with a plurality of word lines in a memory array; and a testing pad PAD for detecting the presence of an electric current to flow between the sources and drains of the plurality of MOSFETs. If the word line is short-circuited to the power supply to achieve an intermediate potential equal to or higher than the threshold voltage of the MOSFETs, an electric current will flow through the MOSFETs so that the presence of the short-circuit can be accurately detected by measuring the current or voltage in the testing pad PAD.

(2) The plurality of MOSFETs constituting the test circuit are so divided into two blocks as to have different adjoining word lines, and the testing pads PAD for detecting the presence of the electric current are provided for the individual blocks. Another effect obtainable is to detect the short-circuit between the adjoining word lines in addition to that of the power source.

(3) There are provided: a memory array having memory cells connected at intersections between a plurality of word lines and a plurality of data lines; two pairs of MOSFETs connected in series and having their gates connected with the individual adjoining two of sets of a plurality word lines in the memory array; and a testing pad for detecting the presence of a current to flow through the series MOSFETs. A further effect obtainable is to specify the word line which has an short-circuit fault.

(4) There is provided a test circuit which is added to the aforementioned test circuit for specifying the short-circuit fault, so that they can detect the short-circuit fault together. A further effect obtainable is to shorten the testing time by specifying the short-circuit fault only for one having the group short-circuit faults.

(5) Between the junctions of the two pairs of series MOSFETs of the effect (4), there is connected a switch MOSFET to be fed with a testing control signal and selectively turned ON. A further effect obtainable is to detect the group short-circuit faults and specify the portion of the short-circuit fault by one testing pad.

(6) A testing circuit is disposed in the local word lines which are disposed in a plurality of divided memory arrays and adapted to be selected by a select signal transmitted through a main word line and a memory array select signal, so that all the local word lines can be brought into unselected states by the mat selecting operations. A further effect obtainable is to detect the group short-circuit faults easily.

Although our invention has been specifically described in connection with its embodiments, it should not be limited to the embodiments but can naturally modified in various manners without departing from the gist thereof. For example, the word lines may be separately constructed of the global word lines and the local word lines but can be directly selected by a decoder. The testing pad may be disposed as external terminals. In this case, the word line having the short-circuit fault can be located even after the RAM has been completed. The fuse means to be used for storing a defective address can be exemplified in various manners if it can change the electric characteristics equivalently similar to the cutting operation. For example, the fuse means is exemplified by cutting a poly-silicon layer or a thin aluminum wiring line with an energy beam such as a laser beam, by melting the poly-silicon layer with a relatively high current, by annealing the poly-silicon layer with a laser to change its resistance.

The layout over the semiconductor chip of the static RAM can adopt, in addition to those of the foregoing embodiments, a variety of embodiments in which the group of memory mats is arranged at the central portion of the chip whereas peripheral circuits are arranged in the periphery of the chip.

The peripheral circuits of the static RAM may be constructed of a Bi-CMOS circuit having a combination of a CMOS circuit and bipolar transistors. The input-/output interface may adopt not only tile ECL interface but also a CMOS interface or a TTL interface. In case this CMOS interface or TTL interface is adopted, the operating voltage used is at about 5V or a positive voltage VCC of about 3V even for a low voltage operation.

In order to reduce the power consumption and to speed up the operation, the operating voltage of an internal circuit may be set to a level as low as about 3 V. In this case, in order to give an interchangeability with the static RAM of 5 V, the supply voltage of 5 V may be supplied from the outside and dropped by an internal voltage dropping circuit to the aforementioned voltage of about 3 V. In this case, moreover, the input buffer or output buffer is additionally given a level converting Function for conversion to a signal of 5 V.

The present invention can be widely applied to a semiconductor memory device such as not only the static RAM but also a ROM or a programmable ROM.

The effect to be obtained from a representative of the invention disclosed herein will be briefly described in the following. There is provided a test circuit including: a plurality of MOSFETs having their individual gates connected with a plurality of word lines in a memory array; and a testing pad for detecting the presence of an electric current to flow between the sources and drains of the plurality of MOSFETs. If the word line is short-circuited to the power supply to achieve an intermediate potential equal to or higher than the threshold voltage of the MOSFETs, an electric current will Flow through the MOSFETs so that the presence of tile short-circuit can be accurately detected by measuring the current or voltage in the testing pad.

What is claimed is:

1. A semiconductor memory device comprising:
   a memory array including a plurality of word lines, a plurality of data lines, and a plurality of memory cells, each of said plurality of memory cells being coupled to a corresponding one of said plurality of word lines and to a corresponding at least one of said plurality of data lines;
   a detector circuit including a plurality of MOSFETs each of which comprises a gate coupled to a corresponding at least one of said plurality of word lines; and
   pad means for detecting the presence of an electric current flowing through at least one source-drain path of said plurality of MOSFETs,
   wherein said electric current is detected when none of said plurality of word lines are selected.

2. A semiconductor memory device according to claim 1, wherein each of said plurality of MOSFETs has a source-drain path, one end of said source-drain path being fed with a predetermined supply voltage, the other end of said source-drain path being coupled to said pad means.

3. A semiconductor memory device according to claim 1, wherein said pad means includes a first pad and a second pad,
   wherein said plurality of word lines are divided into first word lines and second word lines,
   wherein said plurality of MOSFETs of said detector circuit are divided into a plurality of first MOSFETs and a plurality of second MOSFETs, and
   wherein one end of each of the source-drain paths of said plurality of first MOSFETs are coupled to said first pad, the gates of said plurality of first MOSFETs are coupled to said plurality of first word lines, respectively, one end of each of the source-drain paths of said plurality of second MOSFETs are coupled to said second pad, and the gates of said plurality of second MOSFETs are coupled to said plurality of second word lines, respectively.

4. A semiconductor memory device according to claim 3, wherein the other ends of the source-drain paths of said plurality of first and second MOSFETs are coupled to receive a predetermined supply voltage.

5. A semiconductor memory device according to claim 4, wherein said first and second pads include electrodes formed over a semiconductor substrate.

6. A semiconductor memory device according to claim 1, wherein said plurality of word lines include local word lines, and
   wherein said semiconductor memory device further comprises word line selecting means for selecting at least one of said local word lines, for receiving select signals transmitted through global word lines and local word line select signals.

7. A semiconductor memory device according to claim 6, further comprising:
   fuse means for producing an output signal at an unselected level steadily in said global word lines: and
   means for bringing said local word lines forcibly into the unselected level in response to a cut signal of said fuse means.

8. A semiconductor memory device according to claim 1, wherein said plurality of data lines are divided into a plurality of pairs of data lines, and
   wherein each of said memory cells includes:
   a memory portion comprising first and second inverters each of which includes an input terminal and an output terminal, said input terminal of said first inverter being coupled to said output terminal of said second inverter, and said input terminal of said second inverter being coupled to said output terminal of said first inverter;
   a first transmission gate MOSFET having a source-drain path coupled between one data line of a corresponding pair of data lines and said output terminal of said first inverter, and a gate coupled to a corresponding one of said plurality of word lines; and
   a second transmission gate MOSFET having a source-drain path coupled between the other data line of said corresponding pair of data lines and said output terminal of said second inverter, and a gate coupled to said corresponding one of said plurality of word lines.

9. A semiconductor memory device according to claim 8, wherein each of said first and second inverters comprises a P-channel MOSFET and an N-channel MOSFET in series therewith.

10. A semiconductor memory device comprising:
    a memory array including a plurality of word lines, a plurality of data lines, and a plurality of memory cells arranged in a matrix form;
    detectors provided for every two of said plurality of word lines for detecting that both of the two word lines are at a select level, each of said detectors comprises an output terminal; and a pad commonly coupled to said output terminal of each of said detectors.

11. A semiconductor memory device according to claim 10, wherein each of said detectors includes first and second MOSFETs and third and fourth MOSFETs, the source-drain paths of said first and second MOSFETs and the source-drain paths of said third and fourth MOSFETs being connected individually in series, respectively, the gates of said first and fourth MOSFETs being coupled to one of said corresponding two word lines, the gates of said second and third MOSFETs being coupled to the other of said corresponding two word lines, one end of each of the source-drain paths of said first and third MOSFETs are coupled to receive a predetermined fixed voltage, and one end of each of the source-drain paths of said second and fourth MOSFETs are coupled to said pad.

12. A semiconductor memory device according to claim 10, wherein said pad comprises a first pad and a second pad, and wherein said semiconductor memory device further comprises:
a second detector including a plurality of MOSFETs each of which includes a gate coupled to a corresponding one of said plurality of word lines, and a source-drain path of which one end is coupled to said second pad,
wherein said second pad is provided so as to detect the presence of an electric current flowing through at least one source-drain path of said plurality of MOSFETs.

13. A semiconductor memory device according to claim 12, wherein the other ends of the source-drain paths of said plurality of MOSFETs are coupled to receive a predetermined supply voltage.

14. A semiconductor memory device according to claim 11, wherein said predetermined fixed voltage is a supply voltage to be fed to said semiconductor memory device.

15. A semiconductor memory device according to claim 13, wherein said first and second pads are made of electrodes formed over a semiconductor substrate.

16. A semiconductor memory device according to claim 10, wherein said plurality of word lines include local word lines, and wherein said semiconductor memory device further comprises word line selecting means for selecting at least one of said local word lines, for receiving select signals transmitted through global word lines and local word line select signals.

17. A semiconductor memory device according to claim 16, further comprising:
fuse means for producing an output signal at an unselected level steadily in said global word lines; and
means for bringing said local word lines forcibly into the unselected level in response to a cut signal of said fuse means.

18. A semiconductor memory device according to claim 10, wherein said plurality of data lines are divided into a plurality of pairs of data lines, and wherein each of said memory cells includes:
a memory portion comprising first and second inverters each of which includes an input terminal and an output terminal, said input terminal of said first inverter being coupled to said output terminal of said second inverter, and said input terminal of said second inverter being coupled to said output terminal of said first inverter;

a first transmission gate MOSFET having a source-drain path coupled between one data line of a corresponding pair of data lines and said output terminal of said first inverter, and a gate coupled to a corresponding one of said first and second word lines; and a second transmission gate MOSFET having a source-drain path coupled between the other data line of said corresponding pair of data lines and said output terminal of said second inverter, and a gate coupled to said corresponding one of said first and second word lines.

19. A semiconductor memory device according to claim 18, wherein each of said first and second inverters comprises a P-channel MOSFET and an N-channel MOSFET in series therewith.

20. A semiconductor memory device according to claim 11, wherein each of said detectors further includes a MOSFET switch coupled between a junction of the source-drain paths of said first and second MOSFETs and a junction between the source-drain paths of said third and fourth MOSFETs and having a gate coupled to receive a testing control signal.

21. A semiconductor memory device according to claim 20, wherein said predetermined fixed voltage is a supply voltage to be fed to said semiconductor memory device.

22. A semiconductor memory device according to claim 21, wherein said pad includes an electrode formed over a semiconductor substrate.

23. A semiconductor memory device according to claim 20, wherein said plurality of word lines include local word lines, and wherein said semiconductor memory device further comprises word line selecting means for selecting at least one of said local word lines, for receiving select signals transmitted through global word lines and local word line select signals.

24. A semiconductor memory device according to claim 23, further comprising:
fuse means for producing an output signal at an unselected level steadily in said global word lines; and
means for bringing said local word lines forcibly into the unselected level in response to a cut signal of said fuse means.

25. A semiconductor memory device according to claim 20, wherein said plurality of data lines are divided into a plurality of pairs of data lines, and wherein each of said memory cells includes:
a memory portion comprising first and second inverters each of which includes an input terminal and an output terminal, said input terminal of said first inverter being coupled to said output terminal of said second inverter, and said input terminal of said second inverter being coupled to said output terminal of said first inverter;

a first transmission gate MOSFET having a source-drain path coupled between one data line of a corresponding pair of data lines and said output terminal of said first inverter, and a gate coupled to a corresponding one of said first and second word lines; and a second transmission gate MOSFET having a source-drain path coupled between the other data line of said corresponding pair of data lines and said output terminal of said second inverter, and a gate coupled to said corresponding one of said first and second word lines.

26. A semiconductor memory device according to claim 25, wherein each of said first and second inverters comprises a P-channel MOSFET and an N-channel MOSFET in series therewith.

27. A semiconductor memory device comprising:
a memory array including first and second word lines, a plurality of first data lines, and a plurality of first memory cells, each of said plurality of first memory cells being coupled to a corresponding one of said first and second word lines and to a corresponding at least one of said plurality of first data lines;
a detector circuit, coupled to said first and second word lines and comprising an output terminal, for first detecting that said first and second word lines are at a select level at the same time; and
pad means coupled to said output terminal of said first detector circuit.

28. A semiconductor memory device according to claim 27, wherein said first detector circuit includes first and second MOSFETs and third and fourth MOSFETs, the source-drain paths of said first and second MOSFETs being connected in series, the source-drain paths of said third and fourth MOSFETs being connected in series, the gates of said first and fourth MOSFETs being coupled to said first word line, the gates of said second and third MOSFETs being coupled to said second word line, one end of the source-drain paths of said first and third MOSFETs being coupled to receive a predetermined fixed voltage, and one end of the source-drain paths of said second and fourth MOSFETs being coupled to said pad means.

29. A semiconductor memory device according to claim 27, wherein said pad means comprises a first pad and a second pad, and
wherein said semiconductor memory device further comprises a second detector circuit including:
a fifth MOSFET having a gate coupled to said first word line, and a source-drain path of which one end is coupled to said second pad; and
a sixth MOSFET having a gate coupled to said second word line, and a source-drain path of which one end is coupled to said second pad, said second pad being provided so as to detect the presence of an electric current flowing through at least one source-drain path of said fifth and sixth MOSFETs.

30. A semiconductor memory device according to claim 29, wherein the other ends of the source-drain paths of said fifth and sixth MOSFETs are coupled to receive a predetermined supply voltage.

31. A semiconductor memory device according to claim 30, wherein said first and second pads include electrodes formed over a semiconductor substrate.

32. A semiconductor memory device according to claim 27, further comprising:
a second memory array including third and fourth word lines, a plurality of second data lines, and a plurality of second memory cells, each of said plurality of second memory cells being coupled to a corresponding one of said third and fourth word lines and to a corresponding at least one of said plurality of second data lines; and
a second detector circuit, coupled to said third and fourth word lines and comprising an output terminal coupled to said pad means, for detecting that said third and fourth word lines are at a select level at the same time.

33. A semiconductor memory device according to claim 27, wherein said first and second word lines include local word lines, and
wherein said semiconductor memory device further comprises word line selecting means for selecting at least one of said local word lines, for receiving select signals transmitted through global word lines and local word line select signals.

34. A semiconductor memory device according to claim 33, comprising:
fuse means for producing an output signal at an unselected level steadily in said global word lines; and
means for bringing said local word lines forcibly into the unselected level in response to a cut signal of said fuse means.

35. A semiconductor memory device according to claim 27, wherein said plurality of first data lines are divided into a plurality of pairs of data lines, and
wherein each of said memory cells includes:
a memory portion comprising first and second inverters each of which includes an input terminal and an output terminal, said input terminal of said first inverter being coupled to said output terminal of said second inverter, and said input terminal of said second inverter being coupled to said output terminal of said first inverter;
a first transmission gate MOSFET having a source-drain path coupled between one data line of a corresponding pair of data lines and said output terminal of said first inverter, and a gate coupled to a corresponding one of said first and second word lines; and
a second transmission gate MOSFET having a source-drain path coupled between the other data line of said corresponding pair of data lines and said output terminal of said second inverter, and a gate coupled to said corresponding one of said first and second word lines.

36. A semiconductor memory device according to claim 35, wherein each of said first and second inverters comprises a P-channel MOSFET and an N-channel MOSFET in series therewith.

37. A semiconductor memory device according to claim 28, wherein said first detector circuit further includes a MOSFET switch having a source-drain path coupled between a junction of said source-drain paths of said first and second MOSFETs and a junction between said source-drain paths of said third and fourth MOSFETs and having a gate coupled to receive a testing control signal.

38. A semiconductor memory device according to claim 37, wherein said predetermined fixed voltage is a supply voltage to be fed to said semiconductor memory device.

39. A semiconductor memory device according to claim 38, wherein said pad means include electrodes formed over a semiconductor substrate.

40. A semiconductor memory device according to claim 29, wherein said first and second word lines include local word lines, and
wherein said semiconductor memory device further comprises word line selecting means for selecting at least one of said local word lines, for receiving select signals transmitted through global word lines and local word line select signals.

41. A semiconductor memory device according to claim 40, further comprising:
   fuse means for producing an output signal at an unselected level steadily in said global word lines; and
   means for bringing said local word lines forcibly into the unselected level in response to a cut signal of said fuse means.

42. A semiconductor memory device according to claim 29, wherein said plurality of first data lines are divided into a plurality of pairs of data lines, and
   wherein each of said memory cells includes:
   a memory portion comprising first and second inverters each of which includes an input terminal and an output terminal, said input terminal of said first inverter being coupled to said output terminal of said second inverter, and said input terminal of said second inverter being coupled to said output terminal of said first inverter;
   a first transmission gate MOSFET having a source-drain path coupled between one data line of a corresponding pair of data lines and said output terminal of said first inverter, and a gate coupled to a corresponding one of said first and second word lines; and
   a second transmission gate MOSFET having a source-drain path coupled between the other data line of said corresponding pair of data lines and said output terminal of said second inverter, and a gate coupled to said corresponding one of said first and second word lines.

43. A semiconductor memory device according to claim 42, wherein each of said first and second inverters comprises a P-channel MOSFET and an N-channel MOSFET in series therewith.

44. A semiconductor memory device according to claim 1, further comprising means for setting a predetermined level to the word line which is defective.

45. A semiconductor memory device according to claim 44, wherein the level of said word line being defective is between a high level and a low level of said plurality of word lines.

46. A semiconductor memory device according to claim 45, wherein said predetermined level is said low level.

47. A semiconductor memory device according to claim 10, further comprising means for setting a predetermined level to the word line which is defective.

48. A semiconductor memory device according to claim 47, wherein the level of said word line being defective is between a high level and a low level of said plurality of word lines.

49. A semiconductor memory device according to claim 48, wherein said predetermined level is said low level.

50. A semiconductor memory device according to claim 27, further comprising means for setting a predetermined level to the word line which is defective.

51. A semiconductor memory device according to claim 50, wherein the level of said word line being defective is between a high level and a low level of said plurality of word lines.

52. A semiconductor memory device according to claim 51, wherein said predetermined level is said low level.

* * * * *